United States Patent [19]
Cohn

[11] 4,097,814
[45] Jun. 27, 1978

[54] PUSH-PULL POWER AMPLIFIER
[75] Inventor: Marvin Cohn, Baltimore, Md.
[73] Assignee: Westinghouse Electric Corp., Pittsburgh, Pa.
[21] Appl. No.: 807,715
[22] Filed: Jun. 17, 1977
[51] Int. Cl.² ............................................. H03F 3/26
[52] U.S. Cl. .................................. 330/286; 330/269; 330/276
[58] Field of Search .................. 330/53, 55, 269, 276, 330/286, 307

[56] References Cited
U.S. PATENT DOCUMENTS
3,821,655  6/1974  Fisher ................................. 330/276
3,869,678  3/1975  Mahoney ............................. 330/286

Primary Examiner—Lawrence J. Dahl
Attorney, Agent, or Firm—R. M. Trepp

[57] ABSTRACT

A push-pull power amplifier for amplifying an input signal is described where anti-phase signals are generated from the input signal using a first hybrid junction for driving a pair of transistors and where anti-phase transistor output signals are combined in-phase on an output line by using a second hybrid junction. An independent port may be added to the hybrid junction for isolating and terminating even order harmonics and even order intermodulation products.

12 Claims, 4 Drawing Figures

PUSH-PULL POWER AMPLIFIER

BACKGROUND OF THE INVENTION

1. Field of the Invention

This invention relates to amplifier circuits, and more particularly, to push-pull amplifiers.

2. Description of the Prior Art

Push-pull amplifiers have been fabricated in the prior art using an input transformer to generate 0° and 180° phase inputs for a pair of transistors and an output transformer for combining the outputs of the pair of transistors in phase. Transformers have been avoided in prior art push-pull amplifiers by using a pair of complementary transistors wherein the pair of transistors are biased so that when one transistor is conducting, the other one is turned off. The use of complementary pairs of transistors, however, is restricted to lower frequencies, less than microwave frequencies.

Attempts have been made to build push-pull FET amplifiers at S and C bands without success as described in an article by R. E. DeBrecht entitled "Coplanar Balun Circuits for GaAs FET High-Power Push-Pull Amplifiers," 1973 IEEE-G-MTT International Microwave Symposium, pp. 309-311, Boulder, Col., June 4-6, 1973; and a report by L. S. Napoli and J. J. Hughes entitled "High Power C-Band Microwave Integrated Transistor Amplifiers," Second Semiannual Report ECOM-0223-2, October 1973, Reports Control Symbol OSD-1366, DA Protect No. 15662705A440 Task 02. The balun used did not have inherent symmetry and was frequency dependent. In addition, it was not capable of providing a fourth isolated port which can be used to reactively tune even harmonics.

At microwave frequencies, microwave hybrid junctions, such as a "magic tee," or a hybrid ring, could be used in place of a transformer to generate 0° and 180° signals, or to combine out-of-phase signals into one phase, but are found to be expensive, large and frequently frequency-dependent.

Another technique for developing anti-phase signals utilizes a slot line tee or microstrip/slot line hybrid junctions which are frequency independent and amenable for fabrication on alumina substrates and which is described in an article by de Ronde, F. C., "A New Class of Microstrip Directional Couplers," Digest of Technical Papers G-MTT International Microwave Symposium, 1970, Newport Beach, Calif., U.S.A., 5-11-70, pages 184 through 189. De Ronde shows a microstrip magic tee which would be useful for generating anti-phase signals on a ceramic substrate. A U.S. patent describing a magic tee utilizing microstrip/slot line hybrid junctions or slot line/microstrip hybrid junctions in U.S. Pat. No. 3,886,500, issued on may 27, 1975, entitled "Flat Hybrid-Tee Structure For Transmitting Wave Energy."

It is therefore desirable to have a broad bandwidth push-pull amplifier which includes the use of microstrip/slot line hybrid junctions which are amenable to integrated circuit packaging techniques.

It is desirable that the microstrip/slot line hybrid junctions provide a fourth port which may permit reactive tuning of the second harmonic and other even order harmonics at any chosen phase while not affecting the fundamental frequency.

It is desirable that the second harmonic be reactively tuned to increase the power output and efficiency of the push-pull amplifier by adjusting in-circuit waveforms to limit peak DC and RF voltages.

It is desirable to provide a push-pull amplifier utilizing microstrip/slot line hybrid junctions wherein the input and output impedances may be adjusted.

It is desirable to provide a push-pull amplifier which may utilize substrate fabrication techniques and unpackaged transistor chips to form a microwave integrated circuit for low cost, size and to be amenable to thermal cooling by means of a heat sink or metallic studs.

It is desirable to utilize microstrip/slot line hybrid junctions for coupling to the input or output signal to isolate even order harmonics within the push-pull amplifier from the input or output circuit to prevent them from affecting the preceding or following stage which is coupled to the input or output signal.

SUMMARY OF THE INVENTION

In accordance with the present invention, a push-pull power amplifier is provided for amplifying an input signal comprising a first and second tee shaped slot line hybrid component, each having a first, second and third arm, the first and second arms of the first and second hybrid component arranged to conduct anti-phase waves on the respective arms derived from a wave on the third arm, a first and second transistor, each having a gate, source and drain, the gate and source of the first transistor coupled across the first arm of the first hybrid component, the gate and source of the second transistor coupled across the second arm of the first hybrid component, the drain and source of the first transistor coupled across the first arm of the second hybrid component, the drain and source of the second transistor coupled across the second arm of the second hybrid component, means for coupling the source of the first and second transistors together, means for coupling an input signal on the third arm of the first hybrid component, and means for coupling an output signal from the third arm of the second hybrid component.

In addition, a push-pull power amplifier is provided for amplifying an input signal comprising bipolar transistors having a emitter, base and collector wherein the emitter connection corresponds to the gate connection, the base connection corresponds to the source connection and the collector connection corresponds to the drain connection in connecting bipolar transistors into the push-pull amplifier.

DESCRIPTION OF THE PREFERRED EMBODIMENTS

Figure 1:
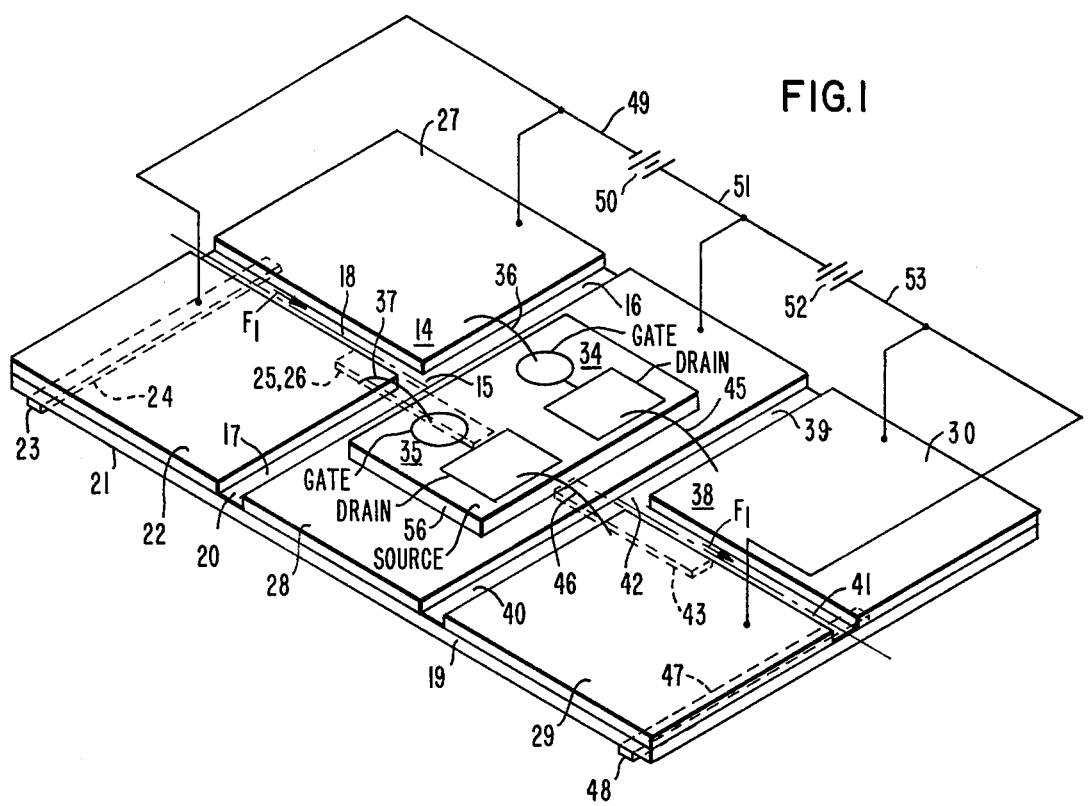
FIG. 1 is one embodiment of the invention, utilizing field effect transistors.

Referring to FIG. 1, a push-pull power amplifier for amplifying an input signal is shown. A first tee shaped slot line hybrid component 14 having a first arm 16, second arm 17, and third arm 18 is shown formed on the upper surface 20 of substrate 19. Substrate 19 may be composed of any insulating dielectric material and has an upper surface 20 and a lower surface 21. The upper surface 20 of substrate 19 is covered with metallization 22 except where slot lines, such as first arm 16, exist. The first arm 16 and second arm 17 of hybrid component 14 are positioned colinear, while the third arm 18 is orthogonal to the first arm 16 and second arm 17 and joins the first and second arms 16 and 17 at junction 15 to form a tee. Hybrid component 14 exhibits bilateral symmetry with respect to a reference line along the center of the third arm. Metallization 23 on the lower surface 21 and metallization 22 on the upper surface 20 provide a microstrip input line that extends across or below third arm 18 to couple input signals from microstrip 24 to third arm 18. Microstrip transmission line 24 functions to provide a means for coupling an input signal onto third arm 18. The input signal travels along the third arm 18 of hybrid component 14 to junction 15 of the tee, where, due to coupling of the electric fields across the slot line arms 16, 17 and 18 at the tee, the input signal splits or divides with a portion of the input signal traveling down first arm 16 and second arm 17. Due to the electric fields at the tee, the phase of the signal as it travels along first arm 16 is 180° out-of-phase or anti-phase with respect to the signal which travels an equal distance along the second arm 17. Hybrid component 14 therefore provides anti-phase waves on first arm 16 and second arm 17 derived from an input signal or wave on the third arm 18. The ends of first arm 16 and second arm 17 may be terminated as an open circuit, or alternatively, the arms or slot lines can be terminated in short circuits by providing a conductive path across the slot line such as from the metal 27 to 28 or 22 to 28 on either side of the slot line at a quarter wavelength from the tee junction of hybrid component 14. A capacitor having a low impedance at the frequencies being amplified may be used to provide the short circuit termination while maintaining DC voltage isolation to facilitate voltage biasing.

A fourth port is added to hybrid component 14 for terminating the second harmonic and even order products which may be on first arm 16 and second arm 17 by adding a microstrip transmission line colinear with the third arm and symmetric across the center of the third arm. Metallization 25 as shown in FIG. 1, is placed on lower surface 21 to provide the microstrip transmission line 26. With microstrip transmission line 26, hybrid component 14 becomes a microstrip/slot line hybrid junction. Microstrip/slot line hybrid junction 14 relies on symmetry to achieve the following properties: (1) Signal energy entering third arm 18 divides equally between first arm 16 and second arm 17. The waves propagating away from the junction along arms 16 and 17 are 180° out-of-phase with each other at equal distances from the junction. (2) Signal energy entering microstrip 26 also divides equally between arms 16 and 17 with no energy going to arm 18. The waves from microstrip 26 propagate away from the junction 15 along arms 16 and 17 in-phase with each other at equal distances from the junction 15. Microstrip/slot line hybrid junction 14 is analogous to the well known waveguide magic tee hybrid junction.

Transistors 34 and 35 may be any three terminal device capable of amplification or signal gain such as a field effect transistor type having a gate, source and drain and positioned on metallization 28. The gate of transistor 34 is coupled by a linear wire bond 36 to the metallization on one side of slot line 16 positioned at a predetermined distance from junction 15. The gate of transistor 35 is coupled by a line or wire bond 37 to the metallization on one side of slot line 17 at a predetermined distance away from junction 15. The source of transistors 34 and 35 are coupled together over a low impedance path and are coupled to metallization 28 which provides an electrical connection to the metallization on the other side of slot lines 16 and 17 opposite lines or wire bonds 36 and 37, respectively.

A second tee shaped slot line hybrid component 38 is formed on the upper surface 20 of substrate 19 by three spaced-apart metallizations 28, 29 and 30, as shown in FIG. 1. Hybrid component 38 has a first arm 39 and a second arm 40 which are colinear with one another and a third arm 41 which orthogonal to arms 39 and 40. The three arms 39, 40 and 41 meet together to form a tee at junction 42. First arm 39 has metallization 28 on one side and metallization 30 on the other to form the slot line. Second arm 40 has metallization 28 on one side and metallization 29 on the other side to form a slot line. Third arm 41 has metallization 29 on one side and metallization 30 on the other to form the slot line. On the lower surface 21 is metallization 43 which is positioned below the third arm 41 and positioned symmetrically with respect to a center line down the middle of third arm 41. Metallization 43 functions as a microstrip transmission line to provide a means for terminating second harmonic and even order products present on arms 39 and 40. Metallization 43 will not be coupled to the fundamental frequency and odd order products on arms 39 and 40 due to the coupling and symmetry of hybrid component 38. Fundamental and odd order products from arms 39 and 40 are coupled out on arm 41. Hybrid component 38 functions to combine anti-phase signals which are inserted on arms 39 and 40 to provide an output signal on arm 41. Hybrid junction 38 functions in the same manner as hybrid junction 14, except that hybrid junction 14 is generating anti-phase signals while hybrid junction 38 is combining anti-phase signals.

Microstrips 26 and 43 may extend a quarter of a wavelength beyond the junction 15 and 42, respectively, to provide a short circuit at the junction 15 or 42 between the microstrip 26 and third arm 18 and between the microstrip 43 and third arm 41. Alternatively, the microstrip may be short circuited across junction 15 or 42 with conductors such as rivets or to provide a frequency independent termination for optimum coupling to the microstrip.

The drain of transistor 34 is coupled by a line or wire bond 45 to one side of slot line 39 such as metallization 30 at a predetermined distance from junction 42. The drain of transistor 35 is coupled by a line or wire bond 46 to one side of slot line 40 such as metallization 29 at a predetermined distance from junction 42. The source of transistors 34 and 35 is coupled to the other side of slot lines 39 and 40 by means of metallization 28.

Signals on arm 41 are coupled to microstrip 47 comprising metallization 48, substrate 19 and metallization 29. Microstrip 47 provides an output signal from the push-pull amplifier, and more particularly, the third arm of hybrid component 38. Metallization 27 is coupled over line 49 to metallization 22 and to one side of battery 50. The other side of battery 50 is coupled over line 51 to metallization 28 and to one side of battery 52. The other side of battery 52 is coupled over line 53 to metallization 30 and metallization 29.

It is desirable that transistors 34 and 35 be a matched pair for optimum performance of the push-pull amplifier as shown in FIG. 1. A matched pair of transistors would have similar DC characteristics, such as $I_D$ vs.

$V_D$ and similar radio frequency characteristics, such as comparable interelectrode capacitances between the drain, source and gate regions. An acceptable matched pair of transistors would be ones selected for other balanced circuits. One example of a device or transistor suitable for transistors 34 and 35 is a gallium arsenide (GaAs) metal epitaxial semiconductor field effect transistor (FET) type MSX803, manufactured by Texas Instruments, Incorporated, Dallas, Tex.

Metallizations 22, 23, 25, 27 through 30, 43 and 48 may be fabricated on substrate 19 by depositing chrome followed by vacuum deposition gold. The spacings between the metallizations to form the slot lines may be for example between 50 to 500 microns apart. The typical impedance of a slot line or arm used in the embodiment of FIG. 1 is 50 ohms and the typical impedance of a microstrip transmission line as shown in the embodiment of FIG. 1 is 50 ohms. The substrate 19 may be alumina having a thickness of 635 microns or, for superior heat dissipation qualities, the substrate may be made of berylia or beryllium oxide.

Figure 2:
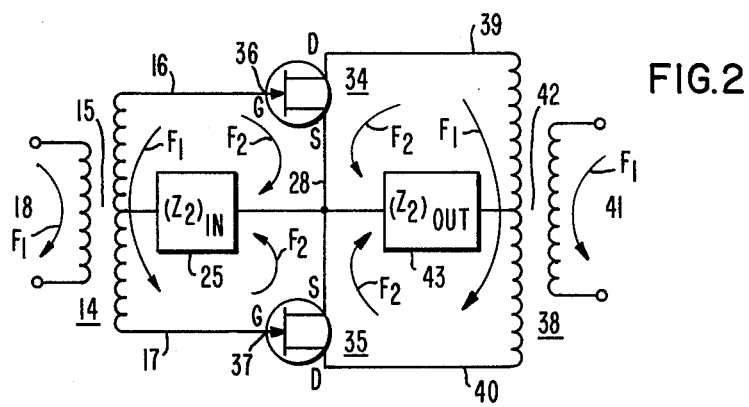
FIG. 2 is an equivalent circuit of the embodiment of FIG. 1.
Figure 4:
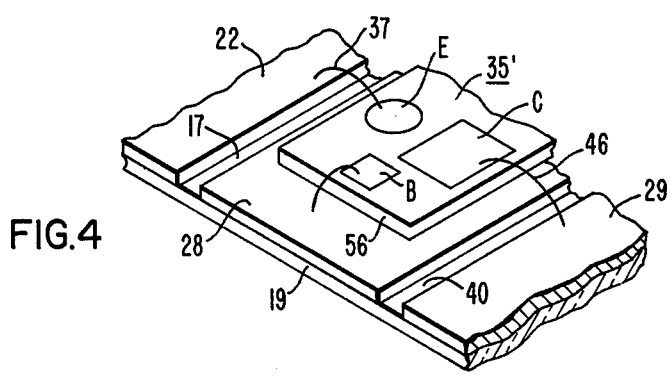
FIG. 4 is a partial view of an alternate embodiment of the invention utilizing bipolar transistors.

FIG. 2 is an equivalent circuit of the embodiment of FIG. 1. The microstrip transmission line or metallizations 25 and 43 of hybrid components 14 and 38, respectively, are isolated from the signal frequency ($f_1$) propagating into the input slot line 18 of hybrid component 14 and out of the output slot line 41 of hybrid component 38. Any even harmonics, primarily second harmonic ($f_2 = 2f_1$), which are generated by each transistor of the push-pull amplifier, will be in-place with each other and will be coupled to the microstrip lines from hybrid junctions 14 and 38 and be isolated from the input arm 18 and the output arm 41, respectively. By proper choice of the dimensions and location of the microstrip transmission lines 25 and 43 (retaining bilateral symmetry), a reactive termination of any arbitrary phase, represented as $(Z_2)_{in}$ and $(Z_2)_{out}$ in FIG. 2, can be presented to the second harmonic while not affecting the fundamental frequency source or load impedance.

The current waveform or voltage waveform of a push-pull amplifier operating class AB or B is rich in harmonics. Normally, the tuned circuits at the amplifier input and output cause the observed harmonics to be low in amplitude. Thus, the harmonics are usually reactively terminated, but the phase of the reactive termination is not controlled. When the current conduction angle is approximately 180° (Class B), a frequent operating condition for power FET's, the current waveform contains a large second harmonic contribution, such as 40% of the amplitude of the fundamental frequency and a negligible third harmonic contribution.

By utilizing a hybrid component, such as 14 or 38 having a fourth port, such as the microstrip transmission line 25 or 43 for coupling in-phase signals from the colinear arms 16 and 17 or 39 and 40, respectively, independent control of the second harmonic impedance may be achieved. The microstrip transmission line 25 or 43 may be terminated with a resistor or reactively by adjusting the length of the microstrip transmission line and leaving the end in an open circuit to provide a reactive termination at a predetermined phase. By having a separate port to terminate the second harmonic independently of the fundamental frequency, the composite current and voltage waveform due to the fundamental and even order harmonics that pass through or across the terminals of the transistors 34 and 35 may be shaped to reduce the peak gate drain voltage across transistors 34 and 35 for a given power level. By modifying the composite waveform of the voltage and current subjected to the transistors, the push-pull amplifier may operate at an increased efficiency and with greater linearity. In addition, the power level of the push-pull amplifier may be increased until the peak gate drain voltage of transistor 34 or 35 is reached.

The basic symmetry of the structure of the hybrid components 14 and 38 also results in the reduction of spurious outputs since, not only even harmonics but also even order intermodulation products and some of the possible parametric oscillations are constrained to flow in the even symmetry microstrip lines metallization lines 25 and 43 rather than the output slot line 41.

The power handling capabilities of transistors 34 and 35 may be increased by connecting several transistors in parallel with transistors 34 and 35. The push-pull configuration allows two transistors to be connected in series for a given power level as compared to other amplifier designs which allow two transistors to be connected in parallel. The push-pull amplifier configuration allows a fourfold increase in the input and output impedances over that of the usual parallel (push-push) configuration. The fourfold increase of impedance is very desirable for coupling to microwave transmission lines, such as slot lines and microstrips.

Transistors 34 and 35 may, for example, be a dual cell FET chip 56 having a common source, as shown in FIG. 1. The dual cell FET chip 56 has a pair of gates and separate drain islands surrounded by a common source which results in the lowest possible common source impedance. The achievement of the minimum common source impedance of transistors 35 and 36 results in greater stability, higher gain and improved frequency response for the push-pull amplifier.

In operation of the embodiment of FIG. 1, a microwave signal to be amplified by the push-pull amplifier, such as a 6 gigahertz pulse or 3 microseconds duration, is coupled to a microstrip 24, which in turn is coupled to third arm 18 of hybrid component 14. The signal on arm 18 divides at hybrid component 14 with one-half of the energy traveling down arm 16 and the other half down arm 17, with the signal in arm 16 in anti-phase or 180° difference with the signal on arm 17 for equal distances traveled from junction 15. The signal along arm 16 is coupled to or across the gate and source of transistor 34 while the signal along arm 17 is coupled to or across the gate and source of transistor 35. The physical arrangement of the bonding wires and transistor location is positioned symmetric with respect to the center line along arm 18 to maintain an antiphase relationship of the signals at the gates of transistors 34 and 35. A biased voltage from battery 50 which may be, for example, in the range of 1 to 5 volts DC, is connected across the gate and source of transistors 34 and 35 by means of metallization 28 and line 51 for connection to the source and by line 49 and metallizations 27 and 22 for the gate. A DC biased voltage from battery 52 is connected across the drain and source of transistors 34 and 35. Battery 52 may have a voltage in the range of 6 to 10 volts, with the positive polarity connected to the drain and the negative polarity connected to the source. Transistors 34 and 35 function to amplify the signals coupled across the gate and source and to provide an output across the drain and source. Transistors 34 and 35 operate as a push-pull amplifier. Since the input to the gate of transistor 34 is 180° out-of-phase with the input to the gate of transistor 35, the output of transistor 34 is 180° out-of-phase with the output of transistor 35.

The anti-phase outputs are recombined by means of hybrid components 38. The output of transistor 34 is coupled across arm 39 and the output of transistor 35 is coupled across arm 40. The anti-phase signals on arms 39 and 40 are combined at junction 42 and coupled to third arm 41. The output signal on arm 41 of hybrid component 38 is coupled to microstrip 47 which provides an output off of substrate 19. The output signal would have the same frequency as the input signal and amplified to a larger or higher power level. Second harmonics and even order intermodulation products may be independently terminated and isolated from arm 41 by means of microstrip or metallization 43 which couples even harmonics and even products from arms 39 and 40. Likewise, microstrip or metallization 25 may couple the second harmonic and even order intermodulation products from arms 16 and 17 of hybrid component 14 and terminate the signals either reactively or resistively. Metallization or microstrip 25 provides a fourth port to terminate the second harmonic and even order intermodulation products to prevent or remove these signals so they do not load down the circuits providing the input signals on arm 18.

Figure 3:
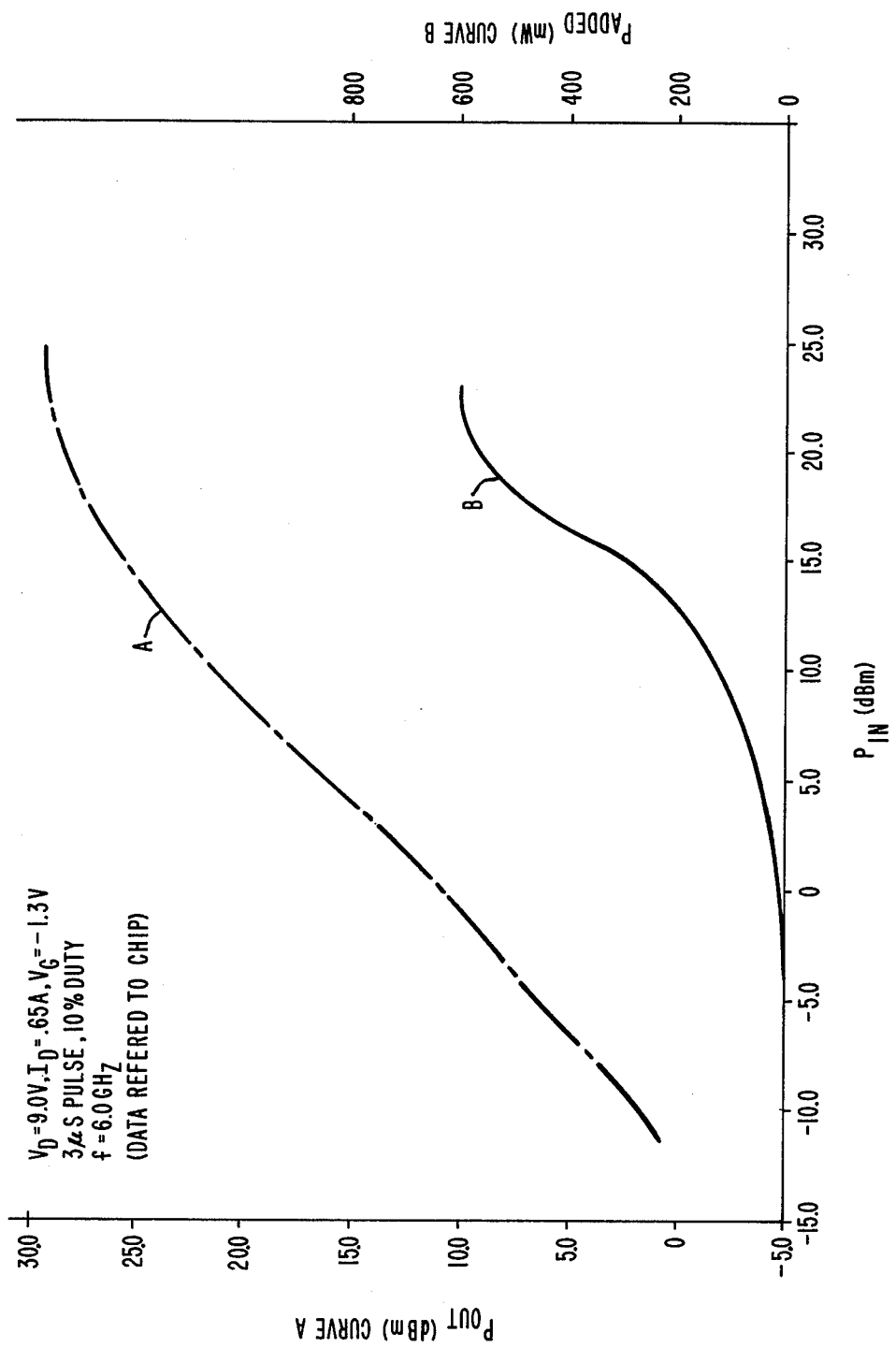
FIG. 3 is a graph showing the output versus the input power for the typical operation of the embodiment of FIG. 1.

Referring now to FIG. 3, curve A shows the output power versus the input power for the embodiment of FIG. 1, except the fourth port or metallization 25 of hybrid component 14 and metallization 43 of hybrid component 38 was not included. The DC voltage across battery 50 was 1.3 volts and the voltage across battery 52 was 9 volts, with a DC current of 0.65 amps. In FIG. 3, the ordinate represents power out in decibels above 1 milliwatt and the abscissa represents power in decibels above 1 milliwatt. The data on curve A is referred to the chip terminals and assumes a 0.6 decibel loss in both the input and output circuits. The frequency of the input signal was approximately 6 gigahertz. Curve B of FIG. 3 shows the power added versus the input power. For curve B, the ordinate represents power added in milliwatts and the abscissa represents input power in decibels above 1 milliwatt. At the point of maximum power added, the gain as shown on curve A is 6.5 decibels and the maximum power added is 600 milliwatts with an input power of 180 milliwatts. As shown in curve A, the small signal gain is 11.5 decibels.

FIG. 5 is an alternate embodiment of the invention utilizing bipolar transistors. In FIG. 5, like references are used for functions corresponding to the apparatus of FIG. 1. Transistor 35' is a bipolar device having an emitter, base, and collector wherein the signal on arm 17 is coupled across the emitter and base and the output signal of the transistor is across the collector and base, which is coupled across arm 40. In a likewise manner not shown, transistor 34 would be replaced with a bipolar transistor. The biased voltages from batteries 50 and 52 would be adjusted, which is well known in the art, for operation of the bipolar transistors.

The invention provides an apparatus for amplifying an input signal comprising a first and second tee shaped slot line hybrid component, each having a first, second and third arm, the first and second arms of the first and second hybrid components arranged to conduct anti-phase waves on the respective arms derived from a wave on the third arm, a first and second transistor, each having a gate, source and drain, the gate and source of the first transistor coupled across the first arm of the first hybrid component, the gate and source of the second transistor coupled across the second arm of the first hybrid component, the drain and source of the first transistor coupled across the first arm of the second hybrid component, the drain and source of the second transistor coupled across the second arm of the second hybrid component, means for coupling the source of the first and second transistors together, means for coupling an input signal onto the third arm of the first hybrid component, and means for coupling an output signal from the third arm of the second hybrid component. The invention further provides an embodiment where the first and second transistors are bipolar and have an emitter, base and collector. Where the emitter is connected in place of the gate, the base is connected in place of the source, and the collector is connected in place of the drain.

The invention further provides where a fourth port may be coupled to the hybrid component for coupling in-phase signals from the first and second arms of the hybrid component to a fourth port.

What is claimed is:

1. A push-pull power amplifier comprising:
   a first and second tee shaped slot line hybrid component each having a first, second and third arm,
   said first and second arms of said first and second hybrid component arranged to conduct anti-phase waves on said respective arms derived from a wave on said third arm,
   a first and second transistor each having a gate, source, and drain,
   said gate and source of said first transistor coupled across said first arm of said first hybrid component,
   said gate and source of said second transistor coupled across said second arm of said first hybrid component,
   said drain and source of said first transistor coupled across said first arm of said second hybrid component,
   said drain and source of said second transistor coupled across said second arm of said second hybrid component,
   means for coupling said source of said first and second transistors together,
   means for coupling an input signal on said third arm of said first hybrid component, and
   means for coupling an output signal from said third arm of said second hybrid component.

2. The push-pull amplifier of claim 1 wherein said first and second hybrid components are positioned on one surface of a substrate.

3. The push-pull amplifier of claim 2 wherein said first transistor is located between said first arms of said hybrid component and said second transistor is located between said second arms of said hybrid component.

4. The push-pull amplifier of claim 2 wherein said first and second arms of said first and second hybrid components are bounded on one side by a common layer of metallization.

5. The push-pull amplifier of claim 2 wherein one of said first and second arms of said first and second hybrid components is terminated by coupling a capacitor across said arm.

6. The push-pull amplifier of claim 1 wherein a first bias voltage is applied across said gate and source of said first and second transistors and a second bias voltage is applied across said source and drain of said first and second transistors.

7. The push-pull amplifier of claim 1 further including a microstrip hybrid component positioned colinear on a second surface with said third arm of said second hybrid component and extending at least to the junction of said first, second and third arms forming a slot line/microstrip hybrid junction for coupling in-phase waves on said first and second arms of said second hybrid component to said microstrip hybrid component.

8. The push-pull amplifier of claim 7 wherein said microstrip hybrid component extends a quarter wavelength beyond said junction at a predetermined wavelength to provide a short circuit at said junction between said microstrip and said third arm.

9. The push-pull amplifier of claim 7 wherein said microstrip hybrid component is short circuited to both sides of said third arm at said junction.

10. The push-pull amplifier of claim 7 wherein the length of said mircostrip is varied to provide a predetermined reactive termination to said even order harmonics.

11. The push-pull amplifier of claim 7 wherein said microstrip is positioned symmetrically over said third arm of said second hybrid component.

12. The push-pull amplifier of claim 1 further including a microstrip hybrid component positioned colinear on a second surface with said third arm of said first hybrid component and extending at least to the junction of said first, second and third arms forming a slot line/microstrip hybrid junction for coupling in-phase waves on said first and second arms of said first hybrid component to said microstrip component.

* * * * *